(12) United States Patent
Harju

(10) Patent No.: US 6,333,856 B1
(45) Date of Patent: Dec. 25, 2001

(54) ARRANGEMENT FOR MOUNTING CHIPS IN MULTILAYER PRINTED CIRCUIT BOARDS

(75) Inventor: Thomas Harju, Sävedalen (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/594,485

(22) Filed: Jun. 16, 2000

(30) Foreign Application Priority Data

Jun. 17, 1999 (SE) .................................................. 9902300

(51) Int. Cl.[7] .................................................. H05K 7/06
(52) U.S. Cl. ..................... 361/761; 361/764; 361/780; 361/794; 361/803; 257/723; 257/728
(58) Field of Search ........................... 361/736, 760–764, 361/780, 784, 792–795, 803, 816, 818; 257/679, 691, 698, 700–704, 723, 724, 728, 784; 333/12, 246, 247; 174/52.4, 250, 255, 261, 262; 438/107, 125

(56) References Cited

U.S. PATENT DOCUMENTS

| | | | |
|---|---|---|---|
| 4,751,482 | * 6/1988 | Fukuta et al. | 333/247 |
| 5,237,204 | * 8/1993 | Val | 257/723 |
| 5,712,767 | * 1/1998 | Koizumi | 361/761 |
| 5,874,321 | * 2/1999 | Templeton, Jr. et al. | 438/125 |
| 5,994,983 | * 11/1999 | Andersson | 333/246 |
| 6,204,442 | * 3/2001 | Garland et al. | 333/247 |

FOREIGN PATENT DOCUMENTS 7221211    8/1995   (JP) .

OTHER PUBLICATIONS

International–Type Search Report dated Feb. 8, 2000.

* cited by examiner

Primary Examiner—Jeffrey Gaffin
Assistant Examiner—John B. Vigushin
(74) Attorney, Agent, or Firm—Burns, Doane, Swecker & Mathis, L.L.P.

(57) ABSTRACT

The present invention relates to an arrangement concerned with multilayer printed circuit boards that enables cavities in said board to be utilized more effectively. A substrate (14) that includes a chip (16) which is connected to the microstrips (17) of the substrate (14) by means of bonding wires (18) is placed on a bonding shelf (13) with the chip (16) orientated towards the bottom of the cavity (6). The microstrips (17) on the substrate (14) therewith come into contact with the microstrips (12) on the bonding shelf (13). The earth plane (15) of the substrate (14) is connected to the upper earth plane (2) by means of bonding wires (19). The arrangement means that the cavity (16) is utilized effectively, at the same time as the substrate (14) protects the underlying chips (7, 16) against mechanical influences.

7 Claims, 2 Drawing Sheets

ARRANGEMENT FOR MOUNTING CHIPS IN MULTILAYER PRINTED CIRCUIT BOARDS

FIELD OF INVENTION

The present invention relates to a multilayer printed circuit board, and more specifically to an arrangement for mounting components, preferably chips, more densely in such printed circuit boards.

BACKGROUND OF THE INVENTION

Many different sorts of multilayer printed circuit boards are known to the art. LTCC (Low Temperature Co-fired Ceramic) will be used hereinafter as an example, although it will be understood that the invention can also be applied in other types of multilayer printed circuit boards.

Briefly, multilayer printed circuit boards are manufactured in the following way. There is obtained on the basis of a printed circuit board design a drawing that contains necessary information, such as the number of layers, the appearance and dimensions of the patterns on the various layers, the locations at which different layers shall contact one another, and so on.

Each layer per se is rolled out from a ceramic mass to a predetermined thickness on a plastic film; this is a so-called tape. Different patterns are punched from these tapes in accordance with the design; among other things, the outer edges of the board, the marks that are later used to match the layers together, and holes for binding different layers together with so-called vias.

Subsequent to configuring the layers, the via holes are filled with a suitable conductive material. The patterns are then printed on each of the layers. A common method in this respect is to use screen printing to correctly position the conductors. These conductors may consist of gold, silver or some other suitable conductive material. When the patterns are in place, the various layers are placed one upon the other until all layers are in position.

The whole of the printed circuit board is then placed under pressure, inserted into an oven and baked immediately (Co-fired) at a relatively low temperature, 700–800 degrees centigrade (Low Temperature), wherewith the ceramic mass is sintered and transformed to a ceramic. Subsequent to this curing or hardening process, it is usual to speak of layers instead of tapes.

In the case of applications for high frequency signals, particularly within the microwave field, it is not always possible to use traditional conductors, since this would result in unacceptable losses and disturbances. A normal requirement in the case of microwave signals is the presence of an earth plane above or beneath a conductor, this earth plane following the conductor. When a conductor only has an earth plane on one side it is called a microstrip. These strips are normally arranged so that they have the printed circuit board on one side and air or a similar dielectric on the other side. In other cases, it is desirable that the conductor is surrounded by both an upper and a lower earth plane, this conductor then being called a stripline. When the distances between a stripline and the earth planes are the same on both sides of the conductor, it is said that the stripline is symmetrical. One advantage afforded by striplines is that radiation from the conductors is small when, e.g., transmitting signals in the microwave range in so-called stripline-mode, which is one reason why such signals are often transmitted in this way. Microstrips and striplines can be easily provided in multilayer printed circuit boards, and are consequently often used to this end. In order to enable conductors to be surrounded by earth planes, conductor planes and earth planes are normally disposed alternately in the printed circuit board.

Apart from the possibility of mounting chips, for instance MMIC (Monolithic Microwave Integrated Circuit), on a multilayer printed circuit board, it is also possible to mount chips in said board. This is achieved by placing the chip on the earth plane or some other carrier in a cavity, and connecting the chip to a signal carrying layer by means of bonding wires. This is shown in FIG. 1, where the chip is connected to a microstrip in a known manner.

One problem that occurs when a chip is mounted in a multilayer printed circuit board in accordance with the aforesaid method is that the board will contain cavities. A cavity means a loss in board volume. This lost volume cannot then be used effectively in the construction of the board.

JP-07221211 describes an arrangement for mounting two chips in a cavity that enhances the utility of the area of a printed circuit board. This known solution involves mounting a substrate above the cavity. The substrate is connected to the printed circuit board electrically by means of a number of vias, and its underside includes a chip. Only two chips can be mounted in the cavity through the medium of this arrangement. Moreover, the substrate is placed on top of the board, therewith increasing board thickness.

SUMMARY OF THE INVENTION

The present invention addresses the problem of enabling cavities in multilayer printed circuit boards to be utilised more effectively.

One object of the present invention is to provide an arrangement for multilayer printed circuit boards which will enable cavities in the board to be utilised more effectively.

In brief, the present invention provides an arrangement which lies in a cavity and with which components, for instance, chips, can be mounted on at least the underside thereof.

In accordance with an exemplary embodiment of the invention, a substrate includes a chip which is connected to microstrips of the substrate via bonding wires. A multilayer printed circuit board includes a cavity, with a bonding shelf near an edge of the cavity. The substrate is placed on the bonding shelf at the edge of a cavity, with the chip oriented inwards towards the bottom of the cavity, thereby bringing microstrips on the substrate into contact with microstrips on the bonding shelf. An earth plane of the substrate on the opposite side of the substrate from the substrate side on which the chip is located, is connected to an upper earth plane of the multilayer printed circuit board via bonding wires.

One advantage with this solution to the problem resides in a compact method of constructing multilayer printed circuit boards in which the construction height is utilised in a manner that enables chips to be mounted in superimposed relationship instead of juxtaposed relationship. This enables the surface of the board to be utilised more effectively.

The invention will now be described in more detail with reference to preferred embodiments thereof and also with reference to the accompanying drawings.

DESCRIPTION OF PREFERRED EMBODIMENTS

Figure 1:
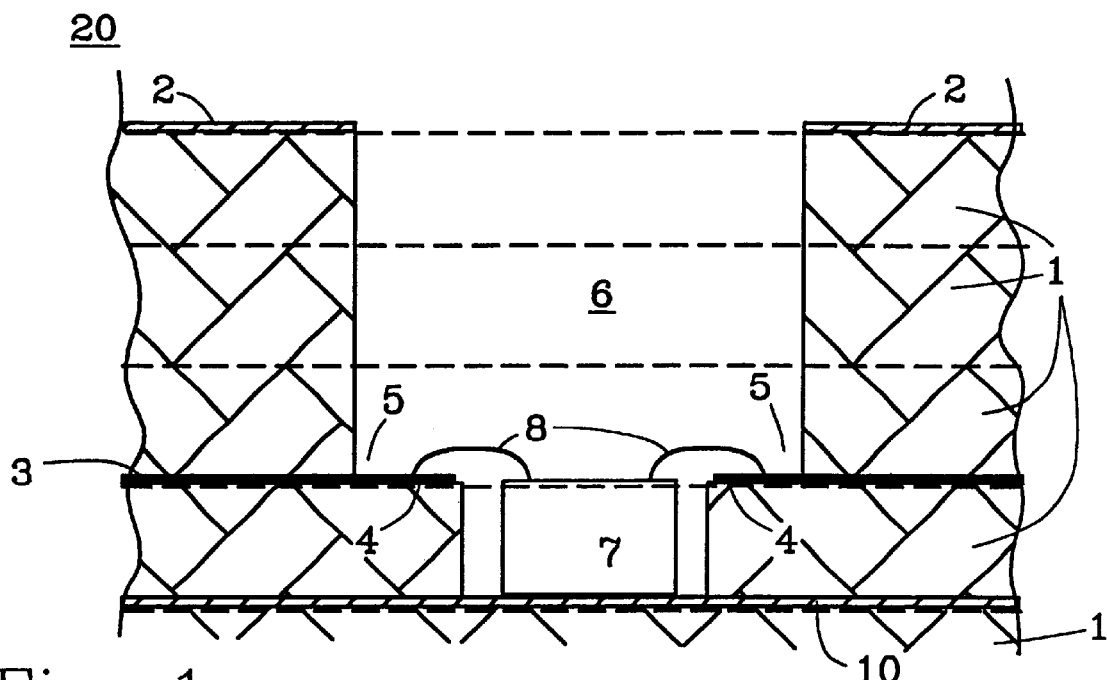
FIG. 1 is a cut-away view of a multilayer printed circuit board and shows a known method of mounting a chip in a cavity, said board being seen from one side thereof.

FIG. 1 is a cut-away view of a multilayer printed circuit board 20 seen from one side of the board. The reference numeral 1 identifies a number of layers, which need not necessarily have the same thickness and on which there is normally mounted conductors of some kind, for instance earth planes 2, 10, signal carrying conductors in the form of a microstrip 4, a symmetric stripline or, as in the illustrated case, an asymmetric stripline 3 or some other appropriate conductor.

If required, each of the aforesaid conductors may be disposed on more than one layer 1. The order in which the conductors are disposed, seen from above or from below, may be varied if so desired. None of these variants has been shown in any of the Figures for the sake of clarity, and all conductors have therefore been shown arranged on only one layer although this will not be interpreted as meaning that the conductors are solely arranged in this particular layer. Moreover, an earth plane may be arranged in an overlying or underlying layer such as to follow the conductor for which it shall constitute an earth plane. This enables an earth plane to be active without unnecessarily covering a wide surface, said earth plane solely extending immediately above the conductor and being sufficiently wider than said conductor. This enables different conductors to be disposed on one and the same layer 1.

A cavity 6 penetrates through both the upper earth plane 2 and a number of layers 1, down to an underlying earth plane 10. The cavity 6 narrows on at least one side of the stripline 3. This results in a transition of the stripline 3 into a microstrip 4 (which only has an earth plane on one side thereof). The region, the shelf, in which the microstrip 4 is located is often called a bond shelf 5. Located furthest down in the cavity 6 is a component, often a chip 7, which can be connected directly to the earth plane 10. This chip 7 is connected to the microstrips 4 on the bond shelf 5 by means of a number of electric contact conductors 8, for instance bonding wires.

As before mentioned, this arrangement means that parts of the cavity 6 are not utilised. Moreover, the entire cavity and the components disposed therein are unprotected.

Figure 2:
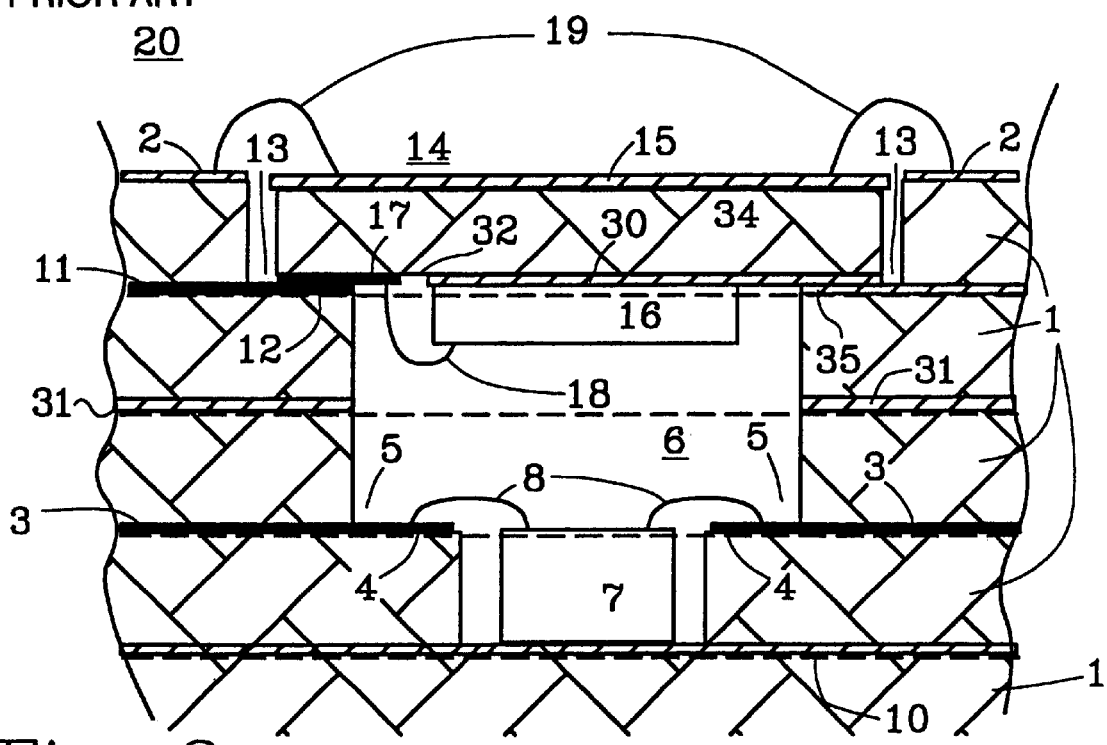
FIG. 2 is a view similar to the view of FIG. 1, showing a basic embodiment of the inventive arrangement.

FIG. 2 is a view similar to the view of FIG. 1, showing a basic embodiment of the inventive arrangement. As in FIG. 1, FIG. 2 shows a number of layers 1, two earth planes 2, 10, a cavity 6 with microstrips 4 on a bonding shelf 5, and a chip 7 connected to the microstrips 4 by means of bonding wires 8.

Among other things, the actual inventive arrangement comprises an earth plane 35 and a further number of microstrips 12 mounted on a bonding shelf 13, wherewith said microstrips 12 may pass or transit into a number of striplines 11. The bonding shelf 13 of the FIG. 2 illustration is located further up in the cavity 6 than the earlier mentioned bonding shelf 5. The bonding shelf 13 acts as edges on which a substrate 14 is placed and optionally secured. The substrate 14 includes a core 34, a pair of earth planes 15, 30 and a number of signal-carrying conductors, microstrips 17. An insulating surface 32 is provided between each microstrip 17 and earth plane 30, in order to avoid electric contact between the earth plane 30 and the microstrips 17, when these are mounted on the same side of the substrate 14. Mounted on the earth plane 30 is a component, in the illustrated case a chip 16, which is connected to the microstrip 17 by means of electric contact conductors (bonding wires) 18.

The substrate 14 is orientated in the cavity 16 such that its second earth plane 15 will be directed upwards, whereas the chip 16 is directed inwards. When the substrate 14 is orientated in this way, the microstrip 17 and the earth plane 30 will also face towards the bottom of the cavity 6. This means that the microstrips 17 on the substrate 14 will be in electric contact with the microstrips 12, when the microstrip 17 extend essentially out to the edges of the substrate 14. Analogously, the earth plane 30 will be in electric contact with the earth plane 35 on the bonding shelf 13. The other earth plane 15 of the substrate 14 is in electric contact with the upper earth plane 2 of the board 20 by virtue of a number of electric contact conductors, in the illustrated case bonding wires 19. The second earth plane 15 may also be earthed by means of vias (not shown in the Figure) extending between the two earth planes 15, 30 of the substrate 14. This obviates the need for bonding wires 19.

In order to secure the electric contact between the bonding shelf conductors and the substrate conductors, the substrate 14 is glued or soldered to the bonding shelf 13, or affixed thereto in some other suitable manner.

It may be desired, or necessary, that no signal carrying conductor is located essentially immediately beneath each other as seen in the cross-direction of the board 20, and that an earth plane is located between said conductors, since this may give rise to interference among other things. For this reason, the printed circuit board 20 includes an earth plane 31 disposed between the strip line 3 and the conductors 11, 12. As before mentioned, however, it is unnecessary for an earth plane to extend over a full layer 1.

Other solutions for preventing conductors from being located "adjacent" to one another are known to the art. For instance, the stripline 3 and the conductors 11, 12 may be disposed so that not all conductors will lie in the plane of the paper of FIG. 2. The aforesaid problem will not exist generally when the stripline 3 extends sufficiently far above or beneath the plane of the paper, since the conductors 11, 12 are located in the plane of said paper. In this latter case, it may also be that the stripline 3 and the stripline 11 are in direct electric contact with each other. This can be achieved, for instance, by connecting the stripline 3, which in the present case does not lie in the plane of the paper, to a via not shown in the Figure. The via extends through the layers 1 until it reaches the layer containing the microstrip 11, where it connects with a microstrip, which leads to the plane of the paper, where it is in contact with said microstrip 11.

Although not shown in the Figure for the sake of clarity, a chip may also be disposed on the earth plane 15 of the substrate 14 if desired, i.e. on top of the substrate 14. In this case, the chip is connected to a number of conductors either analogously with the connection of the chip 16 to the printed circuit board 20, or by means of bonding wires that connect directly to conductors disposed on a layer 1.

Figure 3:
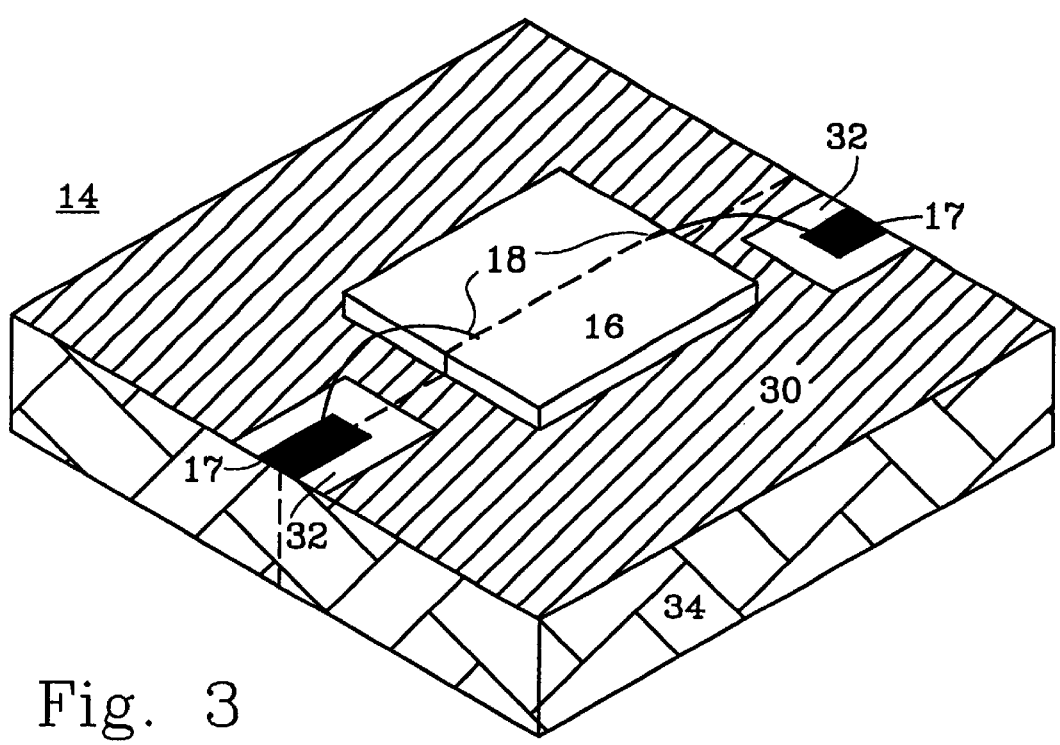
FIG. 3 illustrates in perspective and in greater detail part of the arrangement according to the invention.

FIG. 3 describes the substrate 14 in more detail. The Figure shows the substrate 14 upside down in comparison with FIG. 2, and also in perspective. As in the earlier Figure, FIG. 3 shows a core 34 and a chip 16 mounted on the earth plane 30 and connected to microstrips 17 by means of bonding wires 18. FIG. 3 also shows the surface of section in FIG. 2, with a broken line. The Figure clearly shows that both microstrips 17 and earth plane 30 extend essentially to the edges of the substrate 14. The microstrips 17 are disposed close to the edges of said substrate, whereas the earth plane 30 can cover the remainder of the substrate surface on this side, with the exception of a number of surfaces 32 provided between the microstrips 17 and the earth plane 30, the surfaces 32 having an insulating effect between said microstrips 17 and said earth plane 30.

As both microstrips 17 and earth plane 30 extend to the edges of the substrate 14, they will come into contact with the bonding shelf 13. In addition to the microstrips 12 situated on the bonding shelf 13, said microstrips corresponding to the microstrips 17 on the substrate 14, the bonding shelf 13 can also include a number of earthed conductors (not shown in the Figure) intended for electric contact with the earth plane 30. Furthermore, it will be understood that more than one chip 16 may be mounted on the substrate 14, in which case more microstrips 17 may be required on the substrate 14 and corresponding microstrips 12 required on the bonding shelf 13.

Figure 4:
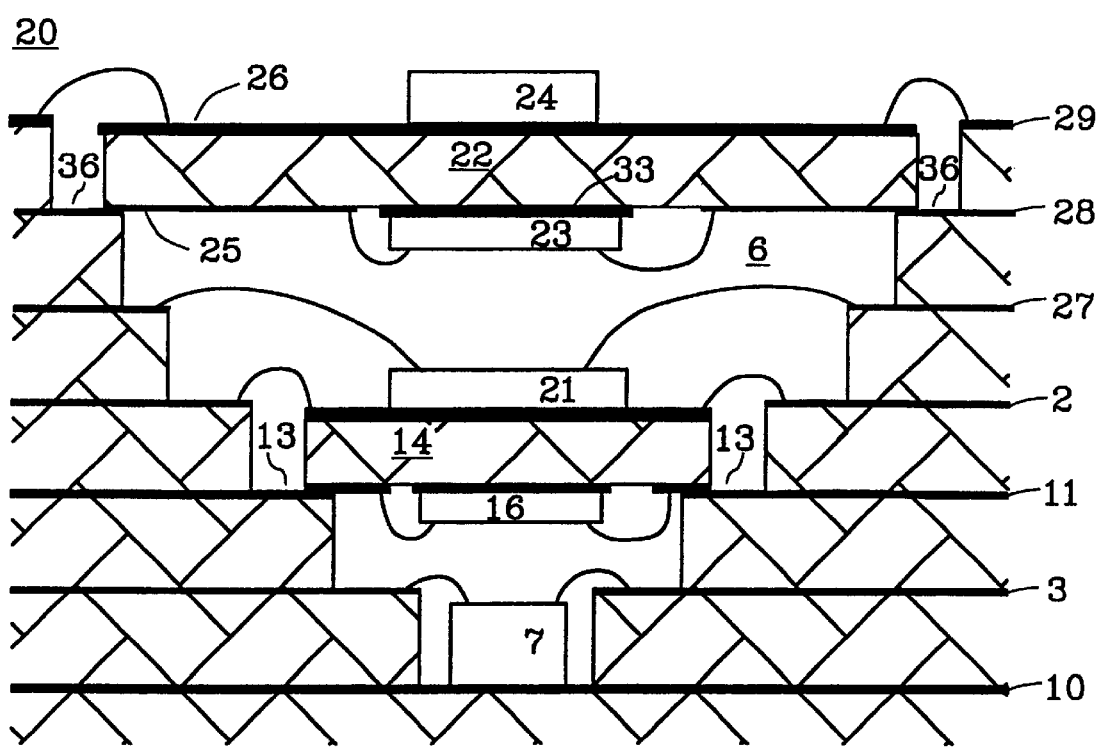
FIG. 4 is a view essentially the same as the view in FIG. 1, and illustrates in simple fashion another embodiment of the inventive arrangement.

FIG. 4 is a simplified illustration of another embodiment of the inventive arrangement. Not all earth planes for instance have been shown, for the sake of clarity. This second embodiment is an enlargement of the basic embodiment, which in the illustrated case is used more than once. As in FIG. 2, FIG. 3 illustrates a multilayer printed circuit board 20 that has a cavity 6. A chip 7 is mounted on the bottom of the cavity 6. Disposed higher up in the cavity 6 is a substrate 14 on which there is mounted a chip 16 that faces towards the bottom of the cavity 6. The printed circuit board 20 also includes a number of different conducting layers: earth planes 2, 10 and striplines 3, 11.

The FIG. 4 embodiment differs from the FIG. 2 embodiment in several ways. For instance, the board 20 of the FIG. 4 embodiment is thicker than the board of the FIG. 2 embodiment and the cavity 6 is deeper. Furthermore, the board 20 includes more layers on which a number of conductors 27, 28 and 29 are mounted. As several different conductors may be mounted on one and the same layer, the reader is referred to FIG. 2 for a more detailed description. The substrate 14 also includes a further chip 21, which is mounted on the opposite side of the substrate 14 to that on which the chip 16 is mounted.

In the case of the FIG. 4 embodiment, a further substrate 22 is disposed in the cavity 6. This substrate 22 is situated further from the bottom of the cavity 6 than the first mentioned substrate 14. This second substrate 22 has a similar construction to the substrate 14, as the substrate includes a number of chips 23, 24 on each side thereof, and a number of microstrips 25 and a pair of earth planes 26, 33. The substrate 22 and the components, chips 23, 24 and conductors mounted thereon is in electric contact with the board 20 in essentially the same way as the first substrate 14; see the above description of FIG. 2.

In the basic arrangement according to the invention, the substrate 14 forms a cover for the cavity 6 and thus protects underlying chips 7, 16. If desired, a further chip or chips 21 may be mounted on the earth plane 15 of the substrate 14. If the cavity 6 has sufficient depth, the arrangement according to the basic embodiment can be used more than one time. This is achieved by mounting a further substrate 22 higher up in the cavity 6, as in the case of the second embodiment of the inventive arrangement. If the cavity 6 is large enough, more than one substrate according to the basic embodiment can be arranged in the same cavity 6 and on the same layer 1.

Because the cavity 6 is utilised for mounting chips in the vertical extension of said cavity, the surface area of the printed circuit board 20 is appropriated more effectively. This enables the board 20 to be made smaller.

The connection points between chip and substrate and board conductors may be more in number than what is shown in the Figures. It will be noted that no conductors and connections for, e.g., control and power supply have been included in the description or shown in any of the Figures. Moreover, the design of component parts may be varied and different materials and types of printed circuit boards may be used.

It will be understood that the invention is not limited to use in solely microwave applications, but that it can also be applied with more conventional multilayer printed circuit boards where high packing densities are desired.

It will also be understood that the invention is not restricted to the aforedescribed and illustrated embodiments thereof, and that modifications can be made within the scope of the accompanying claims.

What is claimed is:

1. An arrangement comprising a multilayer printed circuit board that includes a cavity which encloses at least one first component which is connected electrically to a conductor in the multilayer printed circuit board, and a first substrate that includes at least one first earth plane and a first plurality of signal carrying conductors arranged so that the at least one first earth plane and the first plurality of signal carrying conductors are mutually separated by insulating surfaces, wherein a second component is connected electrically to the first plurality of signal carrying conductors by a plurality of electric contact conductors;

wherein the cavity is formed by gradually narrowing recesses in a number of the layers of the multilayer printed circuit board such that the cavity includes at least a first shelf on which a second plurality of signal carrying conductors and at least one second earth plane are disposed; and wherein the first substrate is arranged on and fixed to the first shelf so that the signal carrying conductors and the at least one first earth plane on the first substrate contact corresponding ones of the second plurality of signal carrying conductors and the at least one second earth plane on the first shelf.

2. An arrangement according to claim 1, wherein the second component has a free upper side that faces towards the bottom of the cavity.

3. An arrangement according to claim 1, wherein the first substrate also includes a second earth plane.

4. An arrangement according to claim 3, wherein the second earth plane is earthed by electric contact with an earth plane on one free side of the multilayer printed circuit board by a number of electrical contact conductors.

5. An arrangement according to claim 3, wherein the second earth plane is earthed by electric contact with the at least one first earth plane on the first substrate by a number of conductive vias through the first substrate.

6. An arrangement according to claim 1, wherein the first substrate includes a third component that is arranged so that the second and third components are located on mutually opposite sides of the first substrate.

7. An arrangement according to claim 1, further comprising a second substrate having generally the same appearance as the first substrate, wherein the cavity further includes a second shelf located further from the bottom of the cavity than said first substrate and wherein the second substrate is disposed on the second shelf.

* * * * *